(12) United States Patent
Rider et al.

(10) Patent No.: US 8,016,114 B2
(45) Date of Patent: Sep. 13, 2011

(54) REDUCTION OF ELECTRIC-FIELD-INDUCED DAMAGE IN FIELD-SENSITIVE ARTICLES

(75) Inventors: Gavin Charles Rider, Avon (GB); Joseph A. Durben, Woodland Park, CO (US); Robert K. Lindsley, Colorado Springs, CO (US)

(73) Assignee: Microtome Precision, Inc., Colorado Springs, CO (US)

( * ) Notice: Subject to any disclaimer, the term of this patent is extended or adjusted under 35 U.S.C. 154(b) by 19 days.

(21) Appl. No.: 12/508,042

(22) Filed: Jul. 23, 2009

(65) Prior Publication Data

US 2009/0321306 A1 Dec. 31, 2009

Related U.S. Application Data

(62) Division of application No. 10/499,416, filed as application No. PCT/US03/30991 on Oct. 1, 2003, now abandoned.

(60) Provisional application No. 60/319,585, filed on Oct. 1, 2002, provisional application No. 60/319,665, filed on Nov. 2, 2002.

(51) Int. Cl.
*B65D 85/00* (2006.01)
(52) U.S. Cl. ...................................... 206/719
(58) Field of Classification Search .................. 206/701, 206/719, 721, 722, 454, 456
See application file for complete search history.

(56) References Cited

U.S. PATENT DOCUMENTS

| 4,308,953 A | 1/1982 | Cohen |
| 4,553,190 A | 11/1985 | Mueller |
| 4,593,339 A | 6/1986 | Robinson |
| 4,792,042 A | 12/1988 | Koehn et al. |
| 4,883,172 A | 11/1989 | Young |
| 5,109,981 A | 5/1992 | Maston, III et al. |
| 5,232,091 A | 8/1993 | Hennessy et al. |
| 5,788,082 A | 8/1998 | Nyseth |
| 6,196,391 B1 * | 3/2001 | Li .................................. 206/719 |
| 6,421,113 B1 * | 7/2002 | Armentrout ..................... 355/75 |
| 6,427,096 B1 * | 7/2002 | Lewis et al. .................... 700/228 |
| 6,826,828 B1 * | 12/2004 | Shen ............................... 29/832 |
| 6,862,817 B1 * | 3/2005 | Lenox ............................. 33/623 |

(Continued)

FOREIGN PATENT DOCUMENTS

| WO | WO-0057929 A1 | 10/2000 |
| WO | WO-02055392 A2 | 7/2002 |
| WO | WO-2004032208 A1 | 4/2004 |

OTHER PUBLICATIONS

In the US Patent and Trademark Office re U.S. Appl. No. 10/499,416, Non-Final OA dated Nov. 24, 2008, 6 pages; and response dated Feb. 17, 2009, 5 pages.

(Continued)

*Primary Examiner* — Jacob K Ackun, Jr.
(74) *Attorney, Agent, or Firm* — Patton Boggs LLP

(57) ABSTRACT

A continuously electrically-conductive container contains an electrically-insulating support for holding an electric-field-sensitive article, such as a reticle, so that the article is shielded from external electric fields and is not in electrical contact with a conductive container wall. A SMIF pod comprises an electrically conductive container for holding an electric-field-sensitive article. A system has boundary walls that form a chamber for a controlled environment. The system includes a load port for receiving a SMIF pod and an end effector made of insulating material for moving a field-sensitive article within the chamber to and from the SMIF pod. An ionizer neutralizes electric charges on the field-sensitive article.

12 Claims, 8 Drawing Sheets

U.S. PATENT DOCUMENTS

| | | | |
|---|---|---|---|
| 6,948,619 B2* | 9/2005 | Su et al. | 206/710 |
| 2002/0124906 A1* | 9/2002 | Suzuki et al. | 141/98 |
| 2003/0232512 A1* | 12/2003 | Dickinson et al. | 438/786 |
| 2004/0005209 A1* | 1/2004 | Su et al. | 414/217.1 |

OTHER PUBLICATIONS

In the US Patent and Trademark Office re U.S. Appl. No. 10/499,416, Final OA dated May 8, 2009, 6 pages.

* cited by examiner

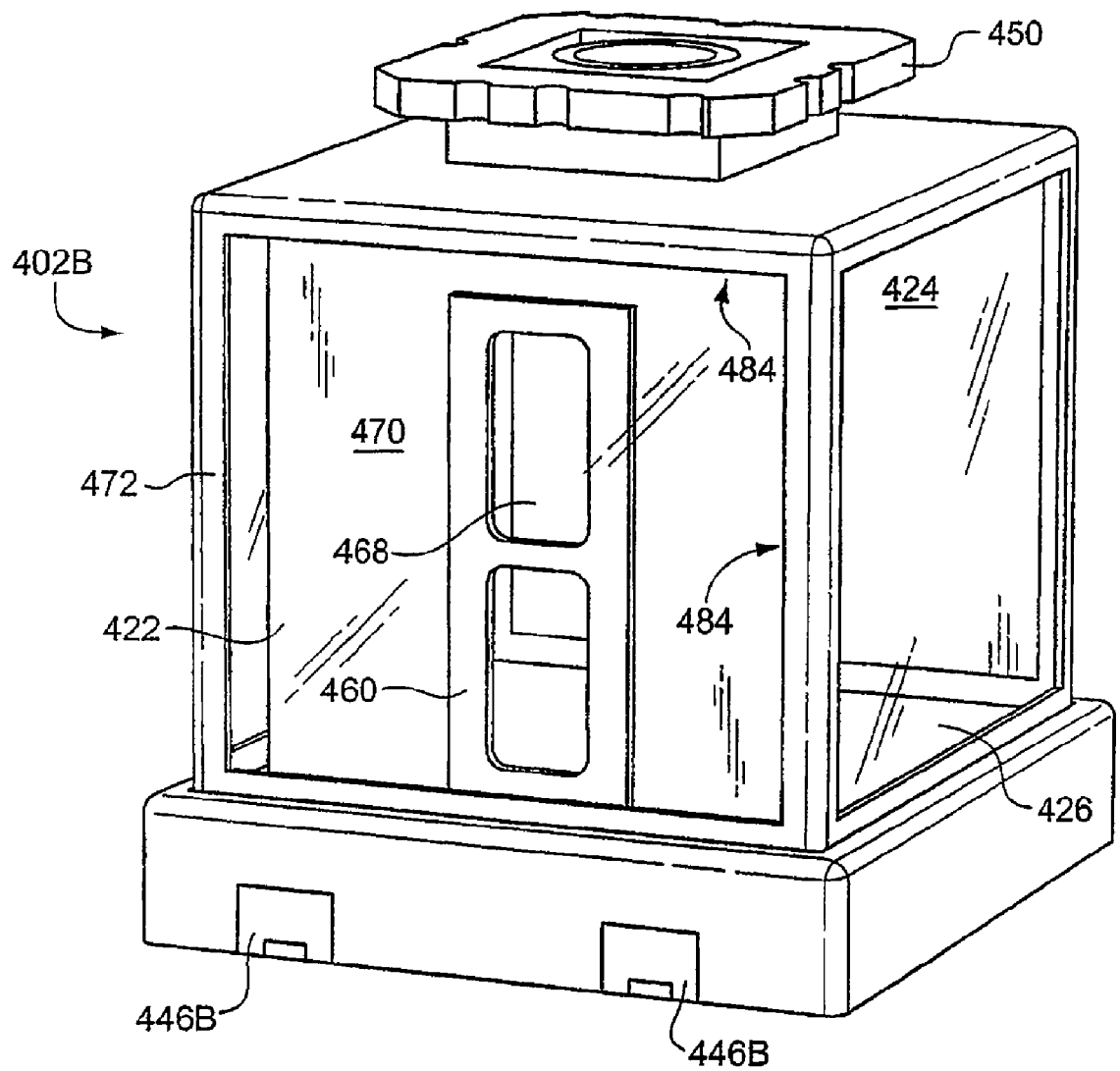

REDUCTION OF ELECTRIC-FIELD-INDUCED DAMAGE IN FIELD-SENSITIVE ARTICLES

CROSS-REFERENCE TO RELATED APPLICATIONS

This Application is a Divisional of U.S. patent application Ser. No. 10/499,416 filed on Nov. 1, 2004 now abandoned. U.S. patent application Ser. No. 10/499,416 is the National Stage filing of PCT Application No. PCT/US03/030991 filed on Oct. 1, 2003. PCT Application No. PCT/US03/030991 claims the benefit of U.S. Provisional Application Ser. No. 60/319,585 filed on Oct. 1, 2002. PCT Application No. PCT/US03/030991 also claims the benefit of U.S. Provisional Application Ser. No. 60/319,665 filed on Nov. 2, 2002. All of the above patent applications, both provisional and non-provisional, are hereby incorporated by reference to the same extent as though fully contained herein.

BACKGROUND OF THE INVENTION

This invention relates to the field of controlling and reducing electric-field-induced damage during integrated circuit fabrication and, in particular, to protection against electric-field-induced damage in reticles.

Certain objects in semiconductor manufacturing, such as packaged devices, silicon wafers and reticles are prone to damage by field-induced potentials. A reticle is an optically clear ceramic substrate (typically quartz) having a thin metal (e.g., chromium) coating in which a pattern has been formed. Field-induced damage can occur even without any electrical contact being made with the sensitive object. The mechanism of damage has been widely identified as resulting from electrostatic discharge (ESD), a mechanism that occurs when the voltage between electrically isolated parts within a device or object is raised by field induction to a point at which a discharge occurs between them. There is a threshold for the occurrence of such discharge, below which the risk of damage is considered to be small. The various thresholds for discharge in different types of object have been estimated and "safe" levels for electric field around them have been prescribed in several places, such as the International Technology Roadmap for Semiconductors.

Much of the information available about static control was developed for spark avoidance where there is an explosion risk, such as in the handling of flammable liquids and vapors. Spark avoidance has also been a priority in semiconductor manufacturing since the radio emissions from spark events can cause data corruption in the electronics used to control process equipment.

To minimize the risk of ESD, it is common practice to control static charge levels in the environments where field-sensitive objects are handled. The guidance given by bodies such as the ESD Association of America for the control of ESD includes the avoidance of all insulators that are not necessary for the process, the use of static dissipative materials wherever the use of metal is inappropriate (e.g., for transparency or chemical inertness), and electrical grounding of all conductive or dissipative parts of the equipment through a common ground point. It is common practice to control static charge levels in handling environments. For example, grounded static dissipative materials are used in semiconductor manufacturing facilities (herein "fabs") to minimize tribocharging of reticle pods and other handling equipment.

Electrostatic buildup on and discharge from reticles can damage or destroy the reticles, and concern about electrostatic damage has been increasing in recent years as device geometries get finer and the requirements for reliability become more stringent.

It is known to store and transfer workpieces, such as semiconductor wafers and reticles, using a standard mechanical interface, or SMIF, system. In conventional SMIF pods, it is known to have conductive contacts on the reticle support in the pod door to dissipate electrostatic charge from the bottom surface of the reticle. The charge is then grounded through the pod door. Similarly, conductive contacts are provided on the reticle retainer in the pod shell to dissipate electrostatic charge from the top surface of the reticle. The charge from the top surface is then grounded through the pod shell. The pod shell, therefore, typically includes static dissipative materials to provide a path to ground for the static charge from the top surface of the reticle. Another type of reticle container provides a conductive path between the reticle retainer and the reticle supports, as disclosed in U.S. Pat. No. 6,513,654, issued Feb. 4, 2003, to Smith et al. This allows electrostatic charge to be dissipated from the top surface of the reticle without the use of static dissipative materials in the pod shell.

Field-sensitive objects often carry electrical charge. An object can acquire a charge through tribocharging during handling, through normal processing such as rinsing with deionized water, through ionizer malfunction and by other events. Not all such situations can be avoided, particularly when charging is an unfortunate by-product of the process itself (such as washing). It is known to provide air ionizers to neutralize electric charges on objects.

BRIEF SUMMARY OF THE INVENTION

The present invention helps to the problems outlined above by providing apparati, systems and methods for avoiding electric-field-induced damage to field-sensitive articles.

A first basic embodiment of an apparatus in accordance with the invention for holding a field-sensitive article comprises a conductive container having an electrically-conductive container wall that defines an enclosure. A conductive container functions as a Faraday cage by substantially preventing an external electric field from passing through the conductive container wall. As a result, the external electric field has no influence in the enclosure within the conductive container or in any objects within the container. Typically, the electrically-conductive container wall comprises substantially only conductive material, but the conductive container wall can also be made from non-conducting material that is coated or embedded with conductive material to make the wall electrically conducting. Another important element of an apparatus in accordance with the invention is an electrically-insulating support located within the enclosure. The electrically-insulating support is configured for supporting a field-sensitive article within the enclosure so that the field-sensitive article is not in electrical contact with the electrically-conductive container wall or with other conductive or static dissipative objects. By keeping the field-sensitive article electrically isolated and distant from the conductive wall of the container (Faraday cage), an apparatus in accordance with the invention further protects a field-sensitive article, such as a reticle, that is possibly carrying an electric charge before it is moved into the conductive container against the risk posed by a charged object being in close proximity to a fixed-potential surface. Conventional systems of the prior art typically support the reticle on static dissipative supports. Preferably, an electrically-insulating support in accordance with the invention comprises substantially only insulative material, such as insulative ceramic or polymer plastic material.

A conductive container in accordance with the invention usually is connected to a controlled potential, preferably a fixed potential, such as electrical ground. Certain embodiments include a distinct controlled electrical potential connected to the conductive container. Accordingly, certain embodiments comprise an electrical connector, such as an electrical conductor or a static dissipative connector, connecting the conductive container to a controlled electrical potential.

In some embodiments, a conductive container is a portion of a SMIF pod. In some embodiments, the electrically-insulating support within the enclosure of the container is configured for supporting a reticle. An apparatus in accordance with the invention optionally includes an ionizer located external to the enclosure for neutralizing an electric charge. It is located within the chamber to neutralize charges that might be on a field-sensitive article before or after it is placed in the enclosure of the container, as well as neutralize charges that might be on insulative internal structures in the chamber or within the conductive container. In some embodiments, a portion of the electrically-conductive container wall is substantially transparent.

Another basic embodiment comprises a system for handling a field-sensitive article. The system includes boundary walls, a chamber defined by the boundary walls, a load port for holding and operating a SMIF pod, a SMIF pod, and an effector for moving an article within the chamber to or from an open SMIF pod. In accordance with the invention, the SMIF pod comprises a conductive container and an electrically-insulating support located within the conductive container. The electrically-insulating support is configured for supporting a field-sensitive article without electrical contact to the conductive container. The effector is an electrically-insulating effector configured for moving a field-sensitive article. Some embodiments further include an electrically-insulating chamber-internal support configured for supporting a field-sensitive article within the chamber without electrical contact to the boundary walls. In preferred embodiments, electrically-insulating structures located within the chamber boundary walls, such as the electrically-insulating chamber-internal support, comprise substantially only insulative material. Some embodiments further comprise an electrically-insulating internal panel located within the chamber. Preferably, the electrically-insulating internal panel comprises substantially only insulative material. In some embodiments, the boundary walls are substantially electrically conductive, often being made from electrically conductive material. In other embodiments, the boundary walls are mainly static dissipative. In preferred embodiments of the system, the boundary walls are connected to a controlled electrical potential or to electrical ground. In some embodiments, the electrically-insulating support is configured for supporting a reticle and the effector is configured for moving a reticle. Some systems in accordance with the invention further an ionizer located within the chamber for neutralizing a electric charges. To provide visibility into the system, some embodiments include at least a portion of the boundary walls that is substantially transparent.

Still another basic embodiment for handling a field-sensitive includes boundary walls, a chamber defined by the boundary walls, and a container within the chamber for holding a field-sensitive article. The container comprises an electrically-conductive container wall in accordance with the invention that defines an enclosure. The system also includes an electrically-insulating support located within the enclosure and configured for supporting a field-sensitive article within the enclosure so that the field-sensitive article is not come into electrical contact with the electrically-conductive container wall or with other conductive or static dissipative objects. The system further includes an ionizer for providing charge-neutralizing ions in the chamber.

A method of avoiding field-induced damage of a field-sensitive article includes holding the field-sensitive article with an electrically-insulating support located within an enclosure defined by an electrically-conductive container wall of a conductive container so that the field-sensitive article does not electrically contact the electrically-conductive container wall. Some methods in accordance with the invention further include locating the conductive container in a chamber having a controlled environment, generating ions in the controlled environment in the chamber, and opening the conductive container in the controlled environment. Some embodiments in accordance with the invention include locating the conductive container in a chamber having a controlled environment, then opening the conductive container in the controlled environment, and then moving the field-sensitive article out of the conductive container into the controlled environment using an electrically-insulating effector.

Thus, a field-sensitive article is protected from the effects of externally generated electric fields and also from the effects of being electrically charged, which might occur during handling.

BRIEF DESCRIPTION OF THE DRAWINGS

A more complete understanding of the invention may be obtained by reference to the drawings, in which:

FIG. 6B depicts a perspective view of a cover portion of a multi-reticle SMIF pod;

DETAILED DESCRIPTION OF THE INVENTION

The invention is described herein with reference to FIGS. 1-12. It should be understood that the structures and systems depicted in schematic form in FIGS. 1, 2, and 4-10 are used to explain the invention and are not precise depictions of actual structures and systems in accordance with the invention. Furthermore, processes are described in the specification with reference to FIGS. 1, 2, 4-10; nevertheless, it is clear that methods in accordance with the invention can be practiced using apparati very different from those depicted in FIGS. 1, 2, 4-10. The preferred embodiments described herein are exemplary and are not intended to limit the scope of the invention, which is defined in the claims below.

Embodiments in accordance with the invention are described herein mainly with reference to the handling of reticles. It is understood, however, that the invention is useful for protecting a wide variety of field-sensitive articles, particularly in semiconductor manufacturing facilities.

Field-induced damage in reticles was previously attributed in the art to multiple low-level ESD events, with voltages being around 150 volts for micron-sized gaps, lower than the minimum of approximately 350 volts predicted by Paschen's Law for inner discharge and atmospheric pressure. Analysis of field-induced damage indicates that in addition to ESD, there are separate and more subtle damage mechanisms, which occur simultaneously as a result of field penetration into the mask image area. These damage mechanisms involve electric field-induced migration ("EFM") of metal (typically chrome) onto the surface of a reticle substrate (typically quartz) between lines. These damage mechanisms take place at lower potential differences in the reticle than those that cause ESD events. Field-sensitive articles have different sensitivity to field-induced potentials. For example, the sensitivity of a reticle depends upon the length, spacing and density of the chrome lines in the image area. The induced-voltage range that results in EFM damage is believed to begin at about 5 V for reticle line gaps of about 1 micron. As integrated-circuit feature dimensions become smaller, the sensitivity of reticles to ESD and EFM increases. EFM is a gradually operating cumulative damage mechanism, so reticle degradation progresses continually over time rather than occurring as a discrete event.

When a field sensitive object such as a reticle is transported within a fab, it passes through many electrostatic hazards. Shielding from externally generated electric fields is a necessary part of the protection of such an object. Shielding from electric fields is provided by placing a fully conductive enclosure around the object. As has been explained, however, bringing a fixed-potential object (such as a grounded container wall or a grounded effector) close to a charged field-sensitive article results in a strong electric field. Embodiments in accordance with the invention help to reduce such risks.

Figure 1:
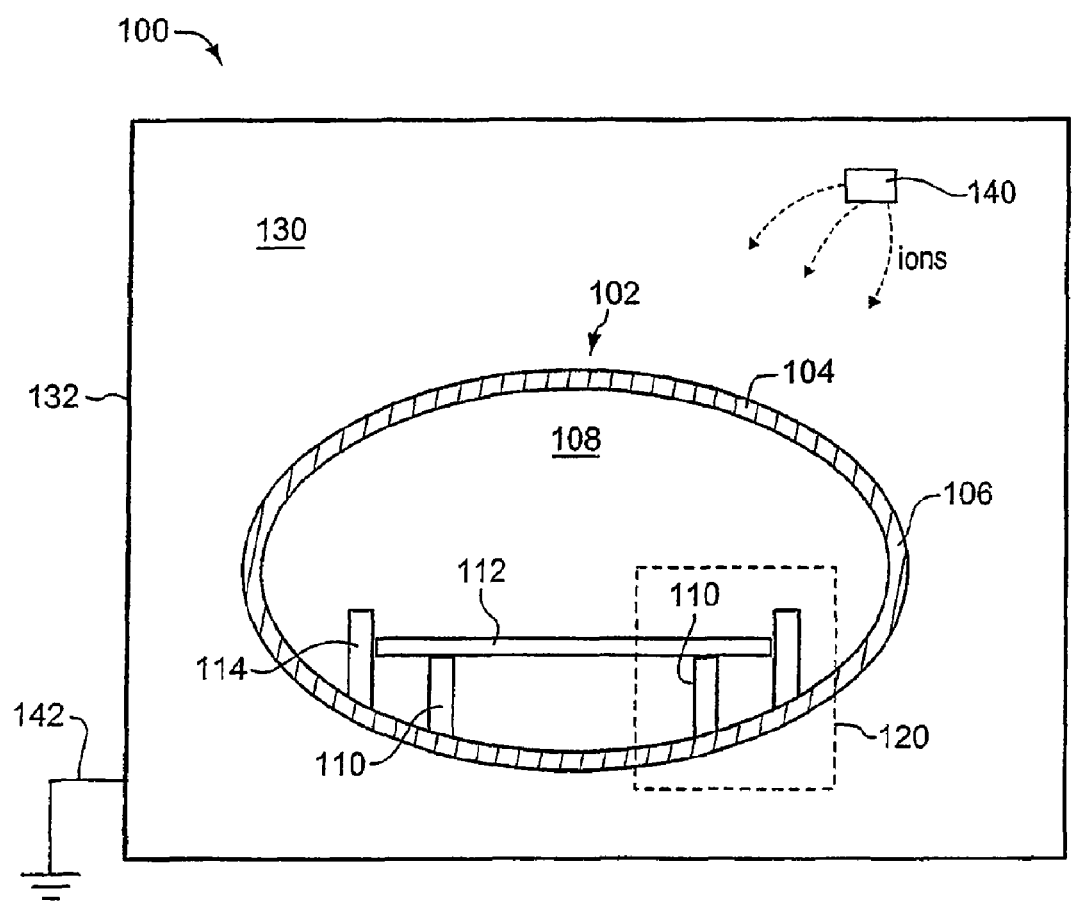
FIG. 1 schematically depicts a cross-sectional view of a generalized basic embodiment of an apparatus in accordance with the invention for holding a field-sensitive article.

FIG. 1 schematically depicts a cross-sectional view 100 of a generalized basic embodiment of an apparatus 102 in accordance with the invention for holding a field-sensitive article. Apparatus 102 includes a conductive container 104 having electrically-conductive container wall 106. Container wall 106 defines an enclosure 108. Apparatus 102 further includes an electrically-insulating support 110 configured for supporting a field-sensitive article 112 within enclosure 108 in such a manner that field-sensitive article 112 does not come in contact with electrically-conducted container wall 106.

Ideally, container wall 106 provides a continuous, integral conductive container enclosing the space of enclosure 108, thereby enclosing a field-sensitive article 112 in a so-called Faraday cage. A container wall that is not a continuous, integral conductive wall still provides protection in the enclosure against electric fields external to the container, but the degree of protection decreases as a container wall becomes less integrally conductive. The material of container wall 106 may comprise substantially only electrically conductive material. Alternatively or in combination with a substantially conductive material, container wall 106 may comprise insulative or static dissipative material that functions as a support for a coating of conductive material, or insulative or static dissipative material embedded with conductive material, such as graphite or other conductive particles, or with an embedded metal mesh. Preferably, the conductive material is a conductive metal, such as stainless-steel-304 or aluminum-6061. Typically, container wall 106 comprises substantially only a conductive metal, such as stainless steel 304. Stainless-steel-304 and other types of stainless steel are commonly used in clean-room environments of integrated-circuit fabrication facilities ("fabs"). When container wall 106 comprises insulative or static dissipative material coated with a conductive material, these materials should be selected to minimize outgassing into enclosure 108.

The term "conductive material" and related terms as used in this specification generally mean a material having a surface resistivity not exceeding approximately $1 \times 10^3$ ohms per square and a volume resistivity not exceeding approximately $1 \times 10^3$ ohm-cm. The terms "insulative material", "insulating material" and related terms are used in this specification generally mean material having a surface resistivity not less than about $1 \times 10^{12}$ ohms per square and a volume resistivity not less than about $1 \times 10^{11}$ ohm-cm. The term "static dissipative material", "dissipative material" and related terms as used in this specification generally mean a material having a surface resistivity in a range of about from $1 \times 10^3$ to $1 \times 10^{12}$ ohms per square and a volume resistivity in a range of about from $1 \times 10^3$ to $1 \times 10^{11}$ ohm-cm. The term "nonconductive material" and related terms in this specification generally means a material showing no significant conductive properties, that is, an insulative material.

The term "electrically conductive" and related terms are used broadly in this specification to refer to a material or to a structure that is, for example, electrically conductive as defined above, or is coated with a conductive material.

The term "electrically insulating" and related terms are used broadly in this specification to refer to a material or to structure that is, for example, electrically insulating as defined above, or is coated with an insulating material.

An electrically-conductive container in accordance with the invention functions as a Faraday cage, effectively shielding the enclosure within a container from electric fields external to the container. An external electric field can arise in a variety of ways, for example, from an electric charge or from alternating current.

A general objective of embodiments in accordance with the invention is to maintain a field-sensitive article 112 in enclosure 108 as far away as possible from surfaces or conductive objects having a ground or other electrical potential. For this reason, electrically-insulating support 110 preferably is made only from insulative material. Practically, an electrically-insulating support 110 in accordance with the invention is physically connected directly or indirectly with conductive container wall 106. Nevertheless, as much as possible of any electrically-insulating support 110 proximate to a field-sensitive article 112 is made from electrically insulative material. As depicted in FIG. 1, apparatus 102 typically includes electrically-insulating internal panels 114. In the embodiment of apparatus 102, internal panels 114 function as insulating side retainers or article-alignment retainers. Ideally, all internal structures, such as electrically-insulating support 110 and internal panels 114, that are located within enclosure 108 are made only from insulative material. When manufacturing or operational constraints do not practically allow an internal structure within enclosure 108 to be made from insulative material, then portions of such a structure that are in the close vicinity of a field-sensitive article 112 while it is supported on support 110 or being moved in or out of enclosure 108 should be made from insulative material. An electrically-insulating support and other structures located within the enclosure function in accordance with the invention even when they comprise conductive material so long as a field-sensitive article only comes into contact with electrically-insulating (insulative) material, for example, with an electrical-insulator coating on the support or other internal structure. Nevertheless, the protection of a field-sensitive article is not as good as when the support or other internal structure comprises only insulative material.

Ideally, a field-sensitive article 112 does not come into close proximity with other conductive surfaces. Therefore, external-electric-field-free enclosure 108 is designed to be as large as possible within manufacturing and operational constraints. The design and locations of support 110, internal panel 114 and other structures in enclosure 108, and container openings (not shown) for moving an article into or out of enclosure 108 are implemented to minimize electric field effects on a field-sensitive article 112.

When an electric charge, such as a static electric charge, exists on a field-sensitive article 112, then an electric field exists between the charge on the article and the internal conductive features of the container and any conductive structures within enclosure 108. The field gradient depends on the distance between the charged article and conductive container wall 106 and any conductive or static dissipative features that are in electrical contact with container wall 106. Furthermore, the intensity of the electric field depends on the charge distribution and the topography of both the field-sensitive article and the internal conductive or dissipative surfaces of container 104. Any protrusions or sharp features on the internal conductive or static dissipative surfaces of the container that might concentrate the field emanating from the charged article increase the risk of field-induced damage, such as ESD and EFM. For this reason, internal structures 110, 114 preferably are made only from insulative material, and conductive container walls 106 preferably are smooth, without sharp protrusions and corners. Conductive container wall 106 depicted in FIG. 1 has a smooth elliptical shape. It is understood that conductive container wall 106 in accordance with the invention can have various shapes. It is also clear that conductive wall 106 can be housed in a structure having a shape different from container wall 106. Also, container wall 106 may comprise one or a plurality of sections that fit together to make a continuous, integral electrically-conductive container in accordance with the invention.

Holding a field-sensitive article 112, such as a reticle, in an external-field-free enclosure 108 of a conductive container 106 on insulating supports 110 does not increase the risk to the article beyond the risk already posed by a) electrically charging it in the first place, and b) modifying the field pattern around the object by placing it within a grounded conductive or static dissipative container to allow the object to be stored or transported in a stable environment to a place where the charge that has been placed on the object can be safely neutralized or dissipated.

A preferred embodiment of the invention includes a fully electrically conductive container (Faraday cage), but the principle of protection against field-induced damage of a charged article through electrical isolation also applies to a static dissipative container.

A reticle used for the production of semiconductor devices is an example of a field-sensitive article suitable for protecting in accordance with the invention. A reticle is typically made of quartz or glass, and typically has a size of about 15 cm by 15 cm height and width and a thickness of about 6 mm. A reticle is coated on one side with a discontinuous light-absorbing metallic film, typically chromium, surrounded by a continuous border of the metal, called the guard ring. Thus, a reticle comprises both insulating and conducting regions, the bulk of the reticle being insulative.

Figure 2:
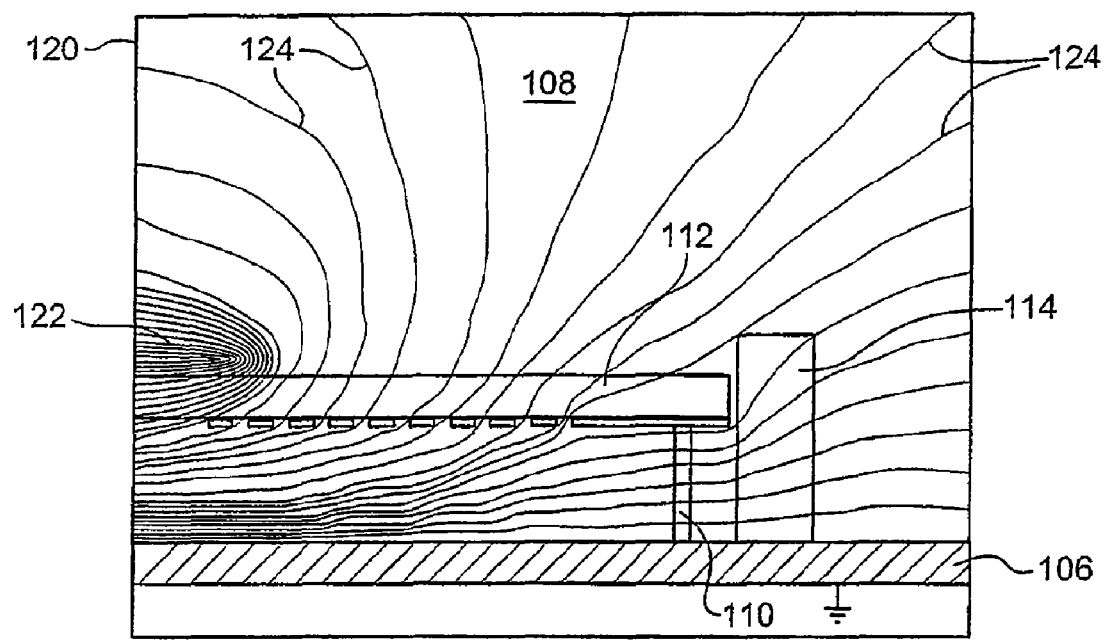
FIG. 2 depicts schematically an enlarged portion of FIG. 1 showing field contours in the vicinity of an electric charge on a reticle.

FIG. 2 depicts schematically an enlarged portion of "window" 120 of FIG. 1. Window 120 in FIG. 2 shows conductive container wall 106, electrically-insulating support 110, field-sensitive reticle 112 located on support 110, and aligning side-retainer 114. Electrically-insulating support 110 and side-retainer 114 comprise only electrically insulative material in accordance with preferred embodiments of the invention. As depicted in FIG. 2, a static electrical charge 122 is located on a surface of field-sensitive reticle 112. As a result, an electric field represented by electric-field contours 124 exists between charge 122 on reticle 112 and conductive wall 106, which is at ground potential. Because support 110 and side-retainer 114 comprise substantially only insulative material, they do not significantly influence the electric field present in enclosure 108.

Figure 3:
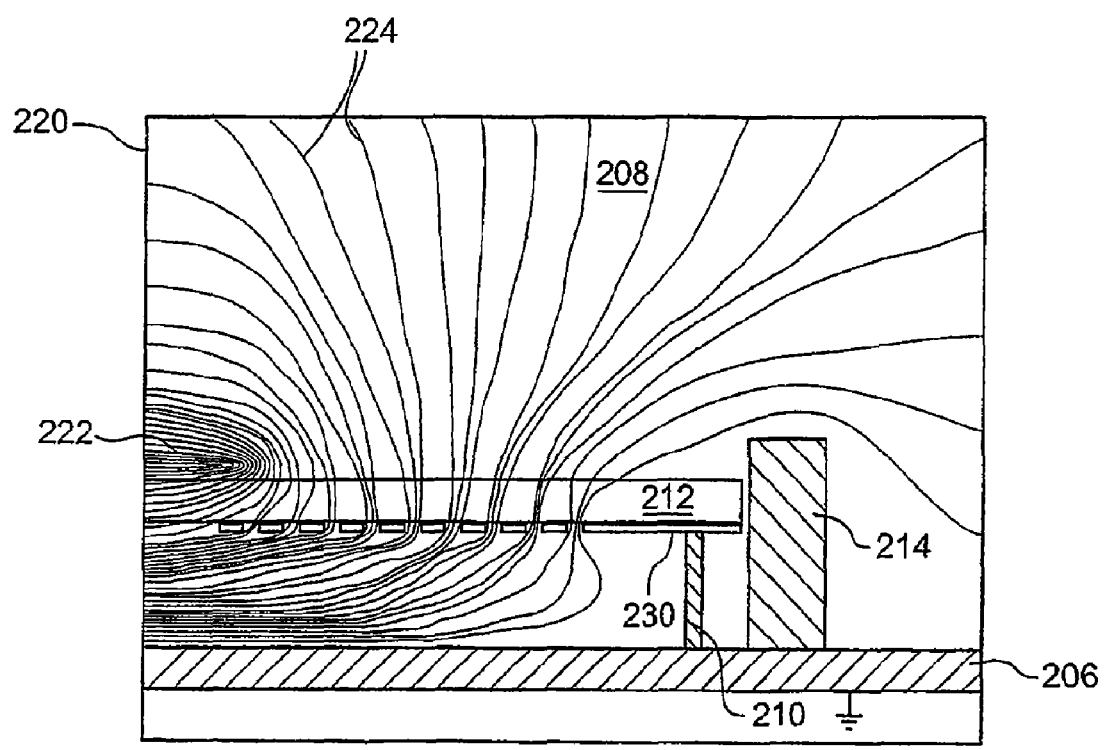
FIG. 3 depicts schematically field contours in the vicinity of an electric charge on a reticle supported by a conventional conductive or dissipative support of the prior art.

FIG. 3 depicts a window 220 that shows a portion of a conventional apparatus in the prior art having a grounded conductive or dissipative container wall 206 that defines an enclosure 208, a grounded conductive or dissipative support 210, and a grounded conductive or dissipative side-retainer 214. An electric charge 222 is located on a reticle 212, causing an electric field represented by electric-field lines 224. Grounded support 210 and grounded side-retainer 214 cause field-sensitive reticle 212 to be at ground potential at contact point 230 at the conductive chromium guard ring of reticle 212. As a result, the voltage contours represented by field contours 224 in FIG. 3 are more compressed compared to the voltage contours in FIG. 2. This causes a higher voltage gradient within field-sensitive reticle 212 than in reticle 112 of FIG. 2 under otherwise similar conditions.

In accordance with the invention, an electrically-conductive container 104 for holding a field-sensitive article 112 with an electrically-insulating support 110 within the container is typically located in a controlled environment within a chamber 130 defined by boundary walls 132, as depicted in FIG. 1. When a container 104 is open to move a field-sensitive article into or out of container 104, typically an ionizer 140 is utilized to neutralize electric charges located within chamber 130 and enclosure 108. The term "chamber" is used broadly to mean a defined space having finite boundaries that make it possible for the environment within the space to be controlled to some desired degree. Typically, boundaries and other structures of a controlled environment of chamber 130 are maintained at a constant electrical potential, as indicated by ground connector 142 in FIG. 1. In some embodiments, electrically-conductive container 104 becomes a part of boundary walls 132, for example, when a SMIF pod is located in a load port. Then, when the pod opened, the exterior surface of the pod remains outside chamber 130, but electrically-conductive container 104 can open within environmentally-controlled chamber 130.

Figure 4:
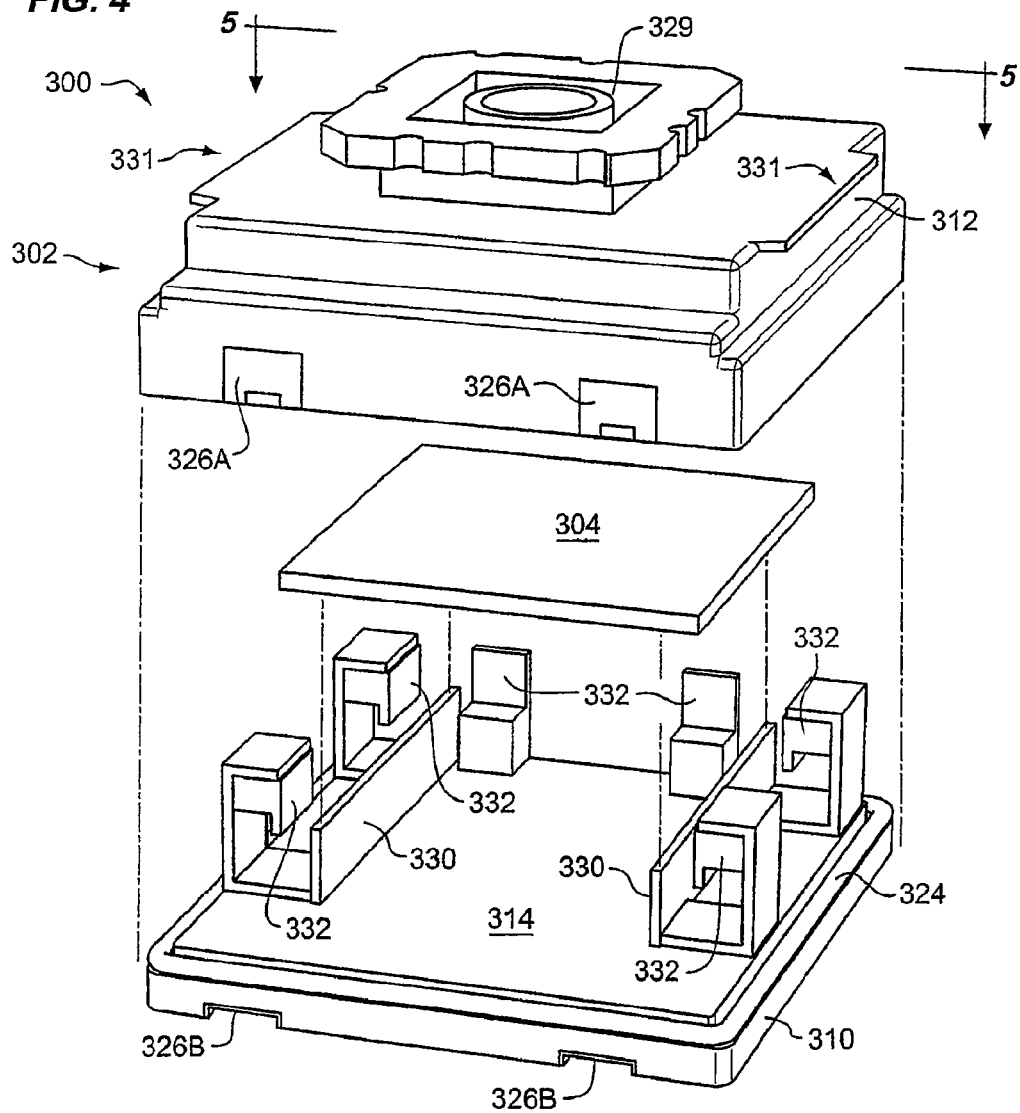
FIG. 4 depicts a perspective view of a SMIF pod for holding a field-sensitive reticle in accordance with the invention.
Figure 5:
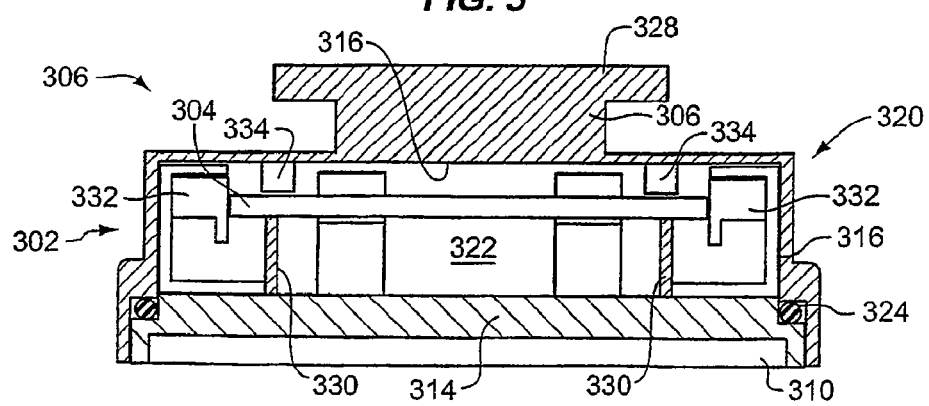
FIG. 5 depicts a cross-sectional view of a SMIF pod in a closed position holding a field-sensitive reticle.

FIG. 4 depicts a perspective view 300 of a SMIF pod 302 for holding a field-sensitive reticle in accordance with the invention. FIG. 4 shows pod 302 in an open position. FIG. 5 depicts a cross-sectional view 306 of pod 302 in a closed position holding field-sensitive reticle 304. Pod 302 includes pod bottom 310 and pod top 312. Pod bottom 310 comprises electrically-conductive lower container wall 314. Pod top 312 includes electrically-conductive upper container wall 316. In a closed position as depicted in FIG. 5, upper container wall 316 and lower container wall 314 form a continuously electrically-conductive container 320 and define enclosure 322. In its closed position, continuous electrically-conductive container 320 functions as a Faraday cage, effectively preventing any electric fields external to container 320 from penetrating into enclosure 322. Pod 302 further includes compliant gasket 324 located between pod bottom 310 and pod top 312 to form a pressure seal when the pod is in a closed position. Suitable compliant materials for gasket 324 are known in the art; for example, vulcanized rubber, Viton, Chemraz or similar materials. Locks 326A, 326B help to establish continuous electrical contact between pod bottom 310 and pod top 312 in a closed position, as well as to establish a pressure seal with compliant gasket 324. Typically, electrically-conductive lower container wall 314 and electrically-conductive upper container wall 316 are made only from conductive metal material, such as stainless steel 304. Alternatively, container walls 314, 316 comprise insulative or static dissipative material that are coated with or are embedded with conductive materials to make container walls 314, 316 sufficiently conductive. Portion 328 of pod top 306 external to container wall 316 typically comprises hard polymer plastic material to minimize weight. Portion 328 of pod top 306 optionally includes an automation flange 329 (see FIG. 4) and manual handles 331. In accordance with the invention, SMIF pod 302 further comprises electrically-insulating supports, or rails, 330 made completely from insulative material. Electrically-insulating supports 330 support field-sensitive reticle 304 in such manner that reticle 304 does not come into electrical contact with electrically-conductive container walls 314, 316, which are typically connected to a constant electrical potential, such as electrical ground. Pod 302 further comprises electrically-insulating side retainers 332 and electrically-insulating vertical retainers 334, which are made completely from insulative material. Supports 330 and retainers 332, 334 are preferably made from insulative materials that will not abrade or chip the reticle 304, for example a soft polymer plastic, such as nylon or delrin. Acetron GP, an acetyl polymer available from GE Polymer, is a suitable insulative plastic typically used for making supports 330 and retainers 332, 334. Insulative ceramic materials, such as quartz, are also suitable for making supports 330 and retainers 332, 334. Alternatively, when it is not practically feasible to make supports 330, retainers 332, 334 and other structures within enclosure 322 completely from insulating material, these enclosure-internal structures can be made partially from conductive or static dissipative material, as long as only insulative surfaces of the structures are in contact with conductive regions of reticle 304. As explained above, protection of a reticle 304 or of some other field-sensitive article increases as the amount and proximity of conductive or dissipative material in enclosure 322 decrease.

Electrically-insulating support 330 preferably comprises substantially insulative material. When support 330 also comprises conductive or static dissipative material covered by insulating material at the contact surfaces with a reticle, then the insulating covering or coating is typically at least about 2 microns thick. To minimize the compression of electric field lines if an electric field exists in the environment of the reticle, there is preferably no conducting or static dissipative material within 2 mm of said reticule, and more preferably not within 10 mm of said reticule.

Similarly, when locating or moving a reticle within a conductive container or within a controlled environment in accordance with the invention, conducting or static dissipative material should be kept at least 2 micron away from said reticule, preferably 2 mm, and more preferably at least 10 millimeters away.

Figure 6A:
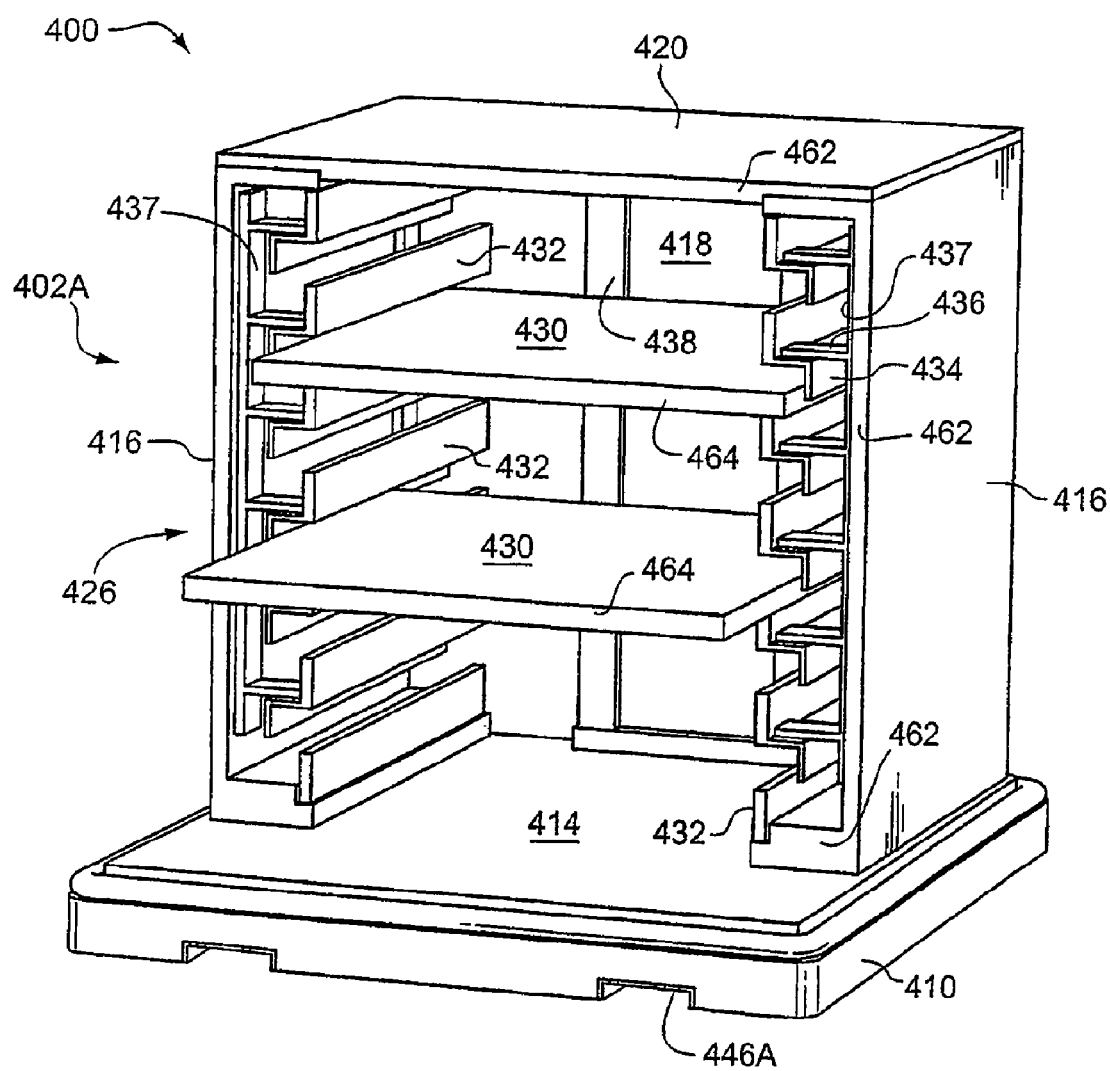
FIG. 6A depicts a perspective view of a cassette portion of a multi-reticle SMIF pod.

FIG. 6A depicts a perspective view of a cassette portion 402A of a multi-reticle SMIF pod 402 (not completely shown). FIG. 6B depicts a perspective view of a cover portion 402B of multi-reticle SMIF pod 402 (not completely shown). Cassette portion 402A includes pod bottom 410. Pod bottom 410 comprises electrically-conductive container lower wall 414. Cassette portion 402A further includes electrically-conductive container sidewalls 416, electrically-conductive container back wall 418, and electrically-conductive container upper wall 420. As depicted in FIG. 6B, cover portion 402B comprises movable electrically-conductive front container wall 422 and electrically-conductive rear panel-walls 424. When cassette portion 402A and cover portion 402B are locked together in their closed position, electrically-conductive walls 414, 416, 418, 420, 422, and 424 form a continuous, integral conductive container wall that defines an enclosure 426 (indicated in FIG. 6A), which corresponds to the space in which field-sensitive reticles 430, electrically-insulating supports 432, and electrically-insulating side retainers 434 are enclosed. Supports 432 and retainers 434 are fastened to insulative stanchions 436, which are integrally connected to insulative mounting strips 437. Mounting strips 437 are attached, typically with screws, to the inside surfaces of conductive container sidewalls 416. Cassette portion 402A further includes compliant gasket 440 located along the outer edge of lower container wall 414. Gasket 440 helps to form a pressure seal between cassette portion 402A and cover portion 402B when pod 402 is in a closed position. Locks 446A, 446B help to establish continuous electrical contact between cassette portion 402A and cover portion 402B when pod 402 is in a closed position, as well as to establish a pressure seal with gasket 440. Typically, electrically-conductive container walls 414, 416, 418, 420, 422, and 424 are made only from conductive metal material, such as stainless steel 304. In certain preferred embodiments, one or more of the conductive walls, particularly movable front wall 422 and rear panel-walls 424, are made from transparent insulative glass or plastic, which are coated with a transparent conductive metal oxide. Alternatively, the insulative glass or plastic contains an embedded metal mesh that does not significantly reduce the optical transparency. Pod top 450 of cover portion 402B typically comprises hard polymer plastic material to minimize weight. Pod top 450 optionally includes an automation flange and manual handles.

In accordance with the invention, electrically-insulating supports 432 and side retainers 434 of cassette portion 402A, as well as their supporting structures 436, 437, which fasten structures 430, 432 to electrically-conductive sidewalls 416, are made completely from insulative material, typically from an insulative plastic, such as Acetron GP. In certain embodiments, supports, retainers, and other supporting structures are made with an insulative ceramic, such quartz. Optionally, the surfaces of ceramic supports 432 and retainers 434 that come into contact with retictles 430 are coated with a thin film of insulative plastic to provide a soft smooth surface.

Pod 402 includes an advancing retainer mechanism comprising advancing retainer 460, depicted in FIG. 6B. When pod cover portion 402B is in a closed and locked position covering cassette portion 402A, electrically-insulating advancing retainer 460 is advanced toward front edge 462 and comes to rest substantially in contact with forward edges 464 of reticles 430. Preferably, advancing retainer 460 is made substantially from only insulating material. Advancing retainer 460 is aligned so that the advancing surface of retainer 460 that comes to rest against the edges 464 of reticles protrudes from the plane of conductive container wall 422. As depicted in FIG. 6B, conductive front wall 422 comprises a transparent conductive wall portion, namely, conductive transparent window 468. Thus, movable front wall 422 includes conductive transparent window 468 and conductive sheet 470. Cover portion 402B includes transparent front panel 472, typically comprising transparent plastic, which does not advance and is not a part of the Faraday cage. Advancing retainer 460 typically comprises insulative plastic, such as Acetron GP. Conductive sheet 470 typically comprises a sheet of conductive metal, such as stainless-steel-304 or aluminum-6061, that is clamped or otherwise fastened to advancing retainer 460 using conventional techniques. Movable conductive front wall 422 does not come into physical or electrical contact with field-sensitive reticles 430 when pod cover portion 402 is in its closed position with advancing retainer 460 typically being in physical contact with field-sensitive reticles 430. Preferably, movable conductive front wall 422 comes into close proximity with conductive edges 462 and with conductive lower wall 414, but preferably does not make physical contact (to avoid creating particles). When a surface of conductive front wall 422 that comes at least within 10 mm of a corresponding opposing surface of edge 462 or lower wall 414, then this proximity typically provides a sufficiently continuous integral portion of a conductive container. To achieve a close fit of front wall 422 to adjoining conductive surfaces at edges 462 or container bottom 414, sheet edges 484 typically are curved inwards.

Figure 7:
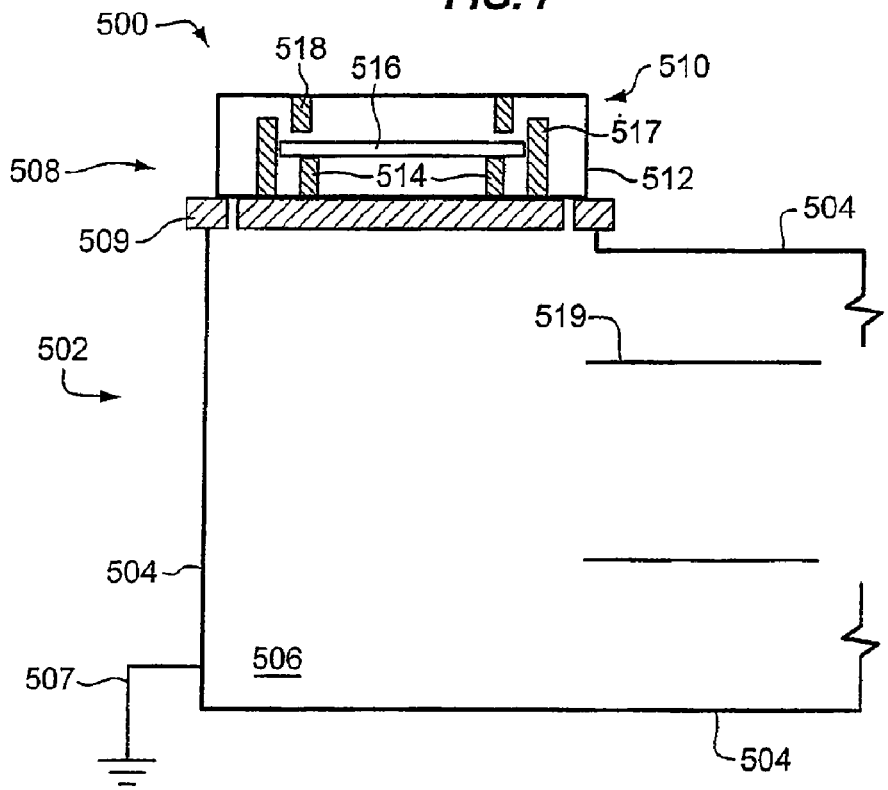
FIG. 7 depicts schematically a cross-sectional view of a system in accordance with the invention containing a SMIF pod, a load port and a controlled environment.
Figure 8:
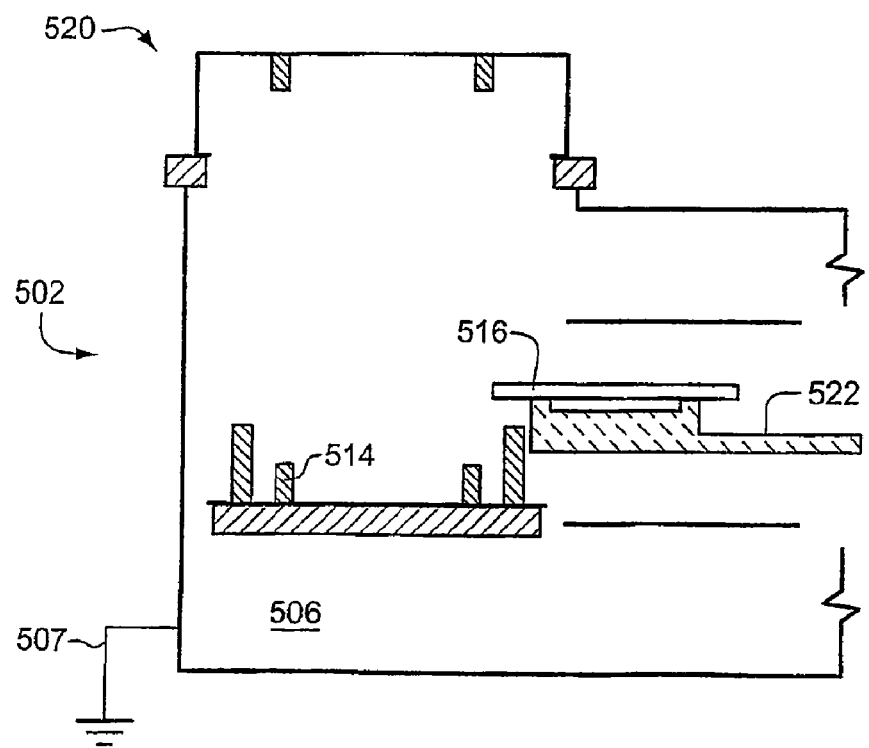
FIG. 8 shows a schematic view of the system of FIG. 7 in which the SMIF pod is in an open position within the controlled environment.
Figure 9:
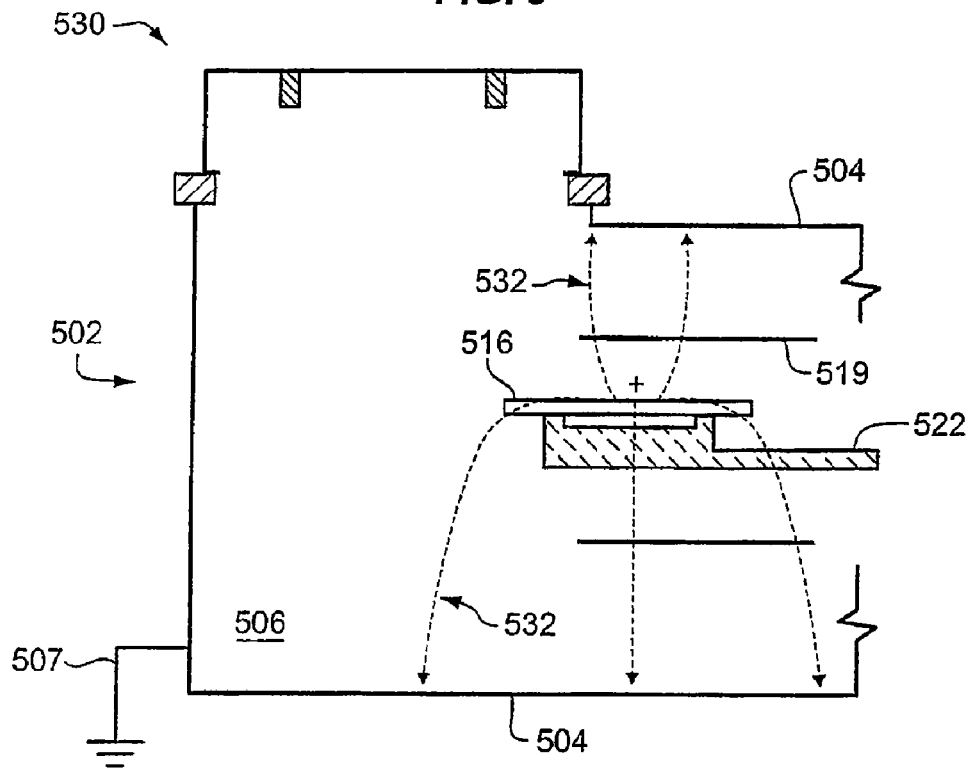
FIG. 9 depicts field lines of an electric field between an electric charge on an article and boundary walls at a different electrical potential, such field lines being largely unperturbed by the insulative effector and insulative internal panels in accordance with the invention.
Figure 10:
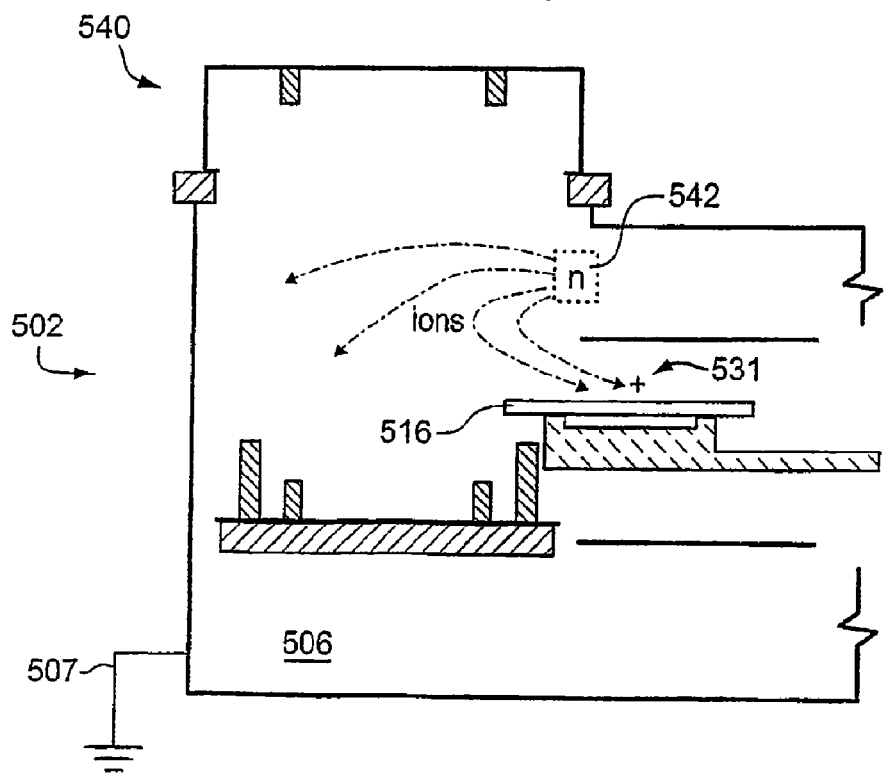
FIG. 10 depicts a system in accordance with the invention comprising an ionizer for neutralizing electrical charges on a field-sensitive article and on insulative panels and other internal structures.

FIG. 7 depicts schematically a cross-sectional view 500 of a system 502 in accordance with the invention. System 502 includes boundary walls 504 that define a chamber 506 having a controlled environment. An electrical connector 507 connects boundary walls 504 to electrical ground or some other fixed potential. Boundary walls 504 often include a transparent portion. The controlled environment of system 502 may be any one of a variety of controlled environments in a fab; for example, a chamber in a manufacturing processing tool or simply a controlled environment between load ports of two SMIF pods. System 502 further includes a load port 508 for holding and operating a SMIF pod and a SMIF pod 510. SMIF pod 510 is depicted in closed position in FIG. 7. When pod 510 is located in load port 508, it is electrically connected by electrical connector 509 to boundary walls 504 and thereby to electrical ground (or some other fixed potential) through connector 507. Preferably, electrical connector 509 is resistive to prevent a rapid electrical discharge in case pod 510 is charged before it is loaded into load port 508. In accordance with the invention, SMIF pod 510 comprises conductive container 512 and electrically-insulating supports 514 for supporting a field-sensitive article 516 so that article 516 does not come into electrical contact with electrically conductive container 512. SMIF pod 510 also comprises electrically-insulating aligners 517 and electrically-insulating vertical retainers 518. Typically, system 502 includes one or more internal panels 519 within chamber 506. In accordance with the invention, internal panels 519 and the ancillary stanchions and other structures supporting them within chamber 506 preferably are made substantially completely from insulative material. The term "internal panel" is used in a general sense to mean any one or several of a variety of structures present in controlled environments of fabs. The meaning of "internal panel" includes, for example: a support rail for supporting a field-sensitive or other article within chamber 506; structures for segregating areas for contamination control; panels for controlling fluid flow within chamber 506; and panels for directing the flow of ions to target locations in chamber 506. FIG. 8 shows a schematic view 520 of system 502 in which SMIF pod 510 is in an open position within the controlled environment of chamber 506. As depicted in FIG. 8, system 502 further comprises an effector 522 for moving a field-sensitive article within chamber 506 to or from opened SMIF pod 510. Effector 522 preferably is made completely from insulative material. In certain embodiments, effect of 522 is made from insulative ceramic material, and is optionally coated with an insulative plastic coating to minimize abrasion. Effector 522 is typically an end effector of a robot arm or a manually operated effector. It is depicted beneath reticle 516 and supporting it under gravity, but it could equally well grip a reticle from the sides or hold a reticle by vacuum applied to the reticle's top surface. As depicted in view 520 of FIG. 8, field-sensitive article 516, such as a reticle, is located in chamber 506 on effector 522, which has removed the article from supports 514. Alternatively, insulative structure 522 is a chamber-internal support for field-sensitive article 516. It is possible for a field-sensitive article 516 to be carrying an electrical charge. FIG. 9 shows a view 530 depicting field lines 532 of an electric field in a system 502 between an electric charge 531 on article 516 and boundary walls 504 when the boundary walls are at a different electrical potential, for example, at electrical ground. Because effector 522 and internal panels 519 are made from insulative material in accordance with the invention, the electric field is not compressed within chamber 506, as indicated by the long field lines 532. In preferred embodiments in accordance with the invention, as depicted in view 540 of FIG. 10, a system 502 comprises an ionizer 542 for neutralizing electrical charges within chamber 506, in particular, static electrical charges on a field-sensitive article 516 and on insulative panels 519 and other internal structures, including the insulative structures within the container 510 when it is opened.

Figure 11:
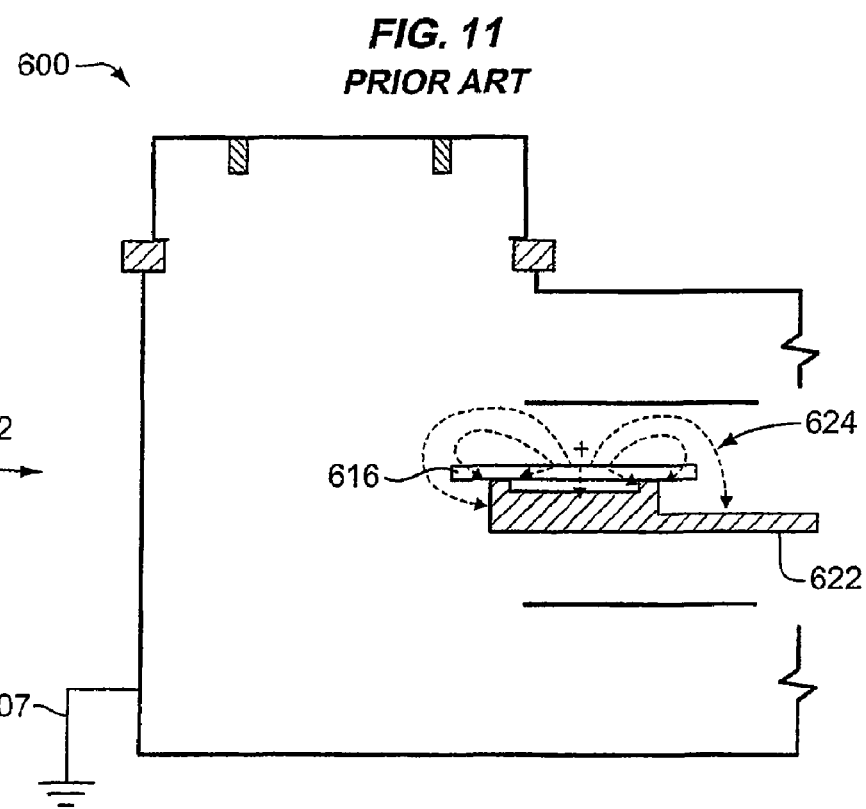
FIG. 11 depicts a conventional system of the prior art that includes an effector made from conductive or static dissipative material, not in accordance with the invention.

FIG. 11 depicts a cross-sectional view 600 of a conventional system 602 of the prior art that includes an effector 622 that is not in accordance with the invention. Effector 622 comprises conductive or static dissipative material that is at a controlled potential, such as ground potential. As a result, an electric field exists between the electric charge on article 616 and effector 622. The dense electric field, indicated by short field lines 624, has a high field strength that is hazardous to a field-sensitive article 616.

Figure 12:
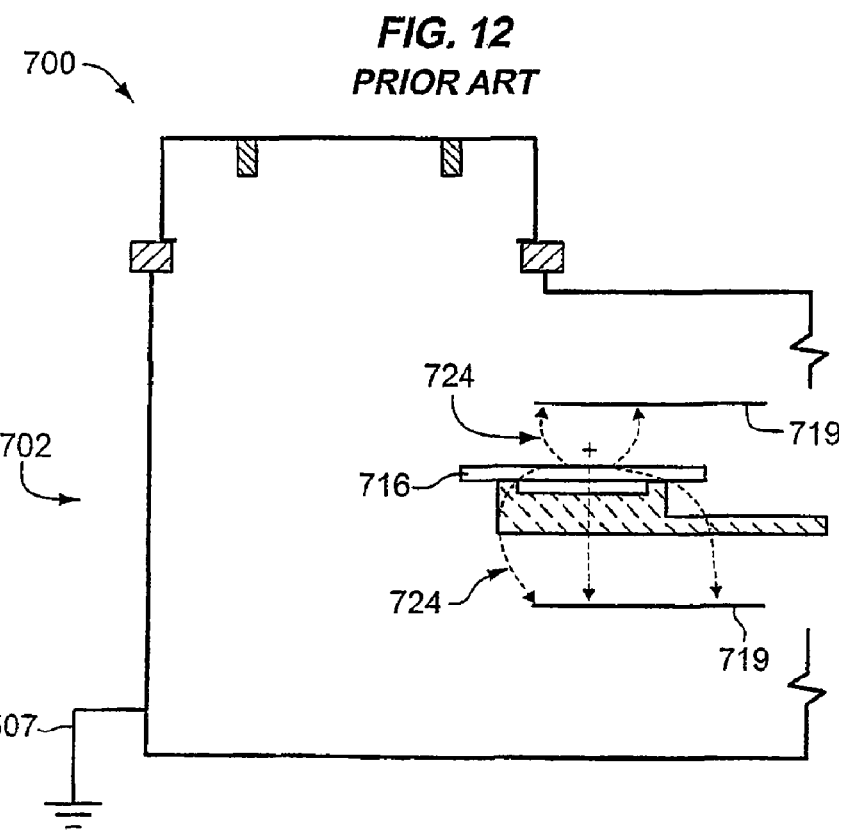
FIG. 12 depicts a conventional system of the prior art that includes internal panels comprising conductive or static dissipative material, not in accordance with the invention.

FIG. 12 depicts a cross-sectional view 700 of a conventional system 702 of the prior art that includes internal panels 719 that are not in accordance with the invention. Internal panels 719 comprise conductive or static dissipative material that is at a controlled potential, such as ground potential. As a result, an electric field exists between the electric charge on article 716 and panels 719. The dense electric field, indicated by short field lines 724, has a high field strength that is hazardous to a field-sensitive article 716.

The particular systems, designs, methods and compositions described herein are intended to illustrate the functionality and versatility of the invention, but should not be construed to be limited to those particular embodiments. Systems and methods in accordance with the invention are useful in a wide variety of circumstances and applications to control and reduce electric-field-induced damage to field-sensitive articles, especially in semiconductor fabs. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawing be interpreted as illustrative and not in a limiting sense. Consequently, the invention is to be construed as embracing each and every novel feature and novel combination of features present in or inherently possessed by the systems, methods and compositions described in the claims below and by their equivalents.

What is claimed as new and desired to be protected by Letters Patent of the United States is:

1. A system for handling a field-sensitive article, said system having boundary walls, a chamber defined by said boundary walls, a load port for holding and operating a SMIF pod, a SMIF pod, and an effector for moving an article within said chamber to or from an open SMIF pod, wherein:

said SMIF pod comprises a conductive container and an electrically-insulating support located within said conductive container, said electrically-insulating support configured for supporting a field-sensitive article without the field-sensitive article making electrical contact to said conductive container; and said effector being an electrically-insulating effector configured for moving a field-sensitive article.

2. A system as in claim 1 wherein said electrically-insulating chamber-internal support is configured for supporting a field-sensitive article within said chamber without electrical contact to said boundary walls.

3. A system as in claim 2 wherein said electrically-insulating chamber-internal support comprises substantially only insulative material.

4. A system as in claim 1 having an internal panel located within said chamber wherein said internal panel is an electrically-insulating internal panel.

5. A system as in claim 4 wherein said electrically-insulating internal panel comprises substantially only insulative material.

6. A system as in claim 1 wherein said boundary walls are substantially electrically conductive.

7. A system as in claim 1 wherein said boundary walls comprise substantially only electrically conductive material.

8. A system as in claim 1 wherein said boundary walls comprise static dissipative material.

9. A system as in claim 1 wherein said boundary walls are connected to a controlled electrical potential.

10. A system as in claim 1 wherein said electrically-insulating support is configured for supporting a reticle and said effector is configured for moving a reticle.

11. A system as in claim 1 wherein an ionizer is located within said chamber for neutralizing an electric charge.

12. A system as in claim 1 wherein a portion of said boundary walls is substantially transparent.

* * * * *